United States Patent
Kishi

(10) Patent No.: US 9,024,695 B2
(45) Date of Patent: May 5, 2015

(54) OSCILLATOR

(71) Applicant: Fujitsu Limited, Kawasaki-shi, Kanagawa (JP)

(72) Inventor: Masakazu Kishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/173,090

(22) Filed: Feb. 5, 2014

(65) Prior Publication Data

US 2014/0340162 A1 Nov. 20, 2014

(30) Foreign Application Priority Data

May 14, 2013 (JP) ................................. 2013-102148

(51) Int. Cl.
*H03B 5/32* (2006.01)
*H03B 5/36* (2006.01)

(52) U.S. Cl.
CPC . *H03B 5/323* (2013.01); *H03B 5/36* (2013.01)

(58) Field of Classification Search
CPC ............. H03B 5/323; H03B 5/32; H03B 5/36
USPC .................... 331/163, 116 R, 116 FE, 158
See application file for complete search history.

(56) References Cited

U.S. PATENT DOCUMENTS

| 4,144,747 A * | 3/1979 | Datwyler, Jr. ............... 73/862.59 |
| 5,406,230 A * | 4/1995 | Yamamoto ....................... 331/46 |
| 8,830,004 B2 * | 9/2014 | Koyama et al. .................. 331/66 |
| 2008/0136542 A1 * | 6/2008 | Hirama ...................... 331/116 R |
| 2011/0221538 A1 * | 9/2011 | Koyama et al. ............... 331/163 |

FOREIGN PATENT DOCUMENTS

JP 2007-037061 A 2/2007

\* cited by examiner

*Primary Examiner* — Ryan Johnson
(74) *Attorney, Agent, or Firm* — Squire Patton Boggs (US) LLP

(57) ABSTRACT

An oscillator includes: a piezoelectric material to vibrate; a first inverting amplifier; a second inverting amplifier; a first output electrode to apply an output signal of the first inverting amplifier to the piezoelectric material; a second output electrode to apply an output signal of the second inverting amplifier to the piezoelectric material; a first input electrode to receive a voltage signal generated by the piezoelectric material and output the voltage signal to the first inverting amplifier; and a second input electrode to receive the voltage signal and output the voltage signal to the second inverting amplifier, wherein the first and second output electrodes are coupled to the piezoelectric material so that faces of the piezoelectric material move in opposite directions, and the first and second input electrodes are coupled to the piezoelectric material so that the voltage signals are input to the first and second input electrodes.

13 Claims, 6 Drawing Sheets

OSCILLATOR

CROSS-REFERENCE TO RELATED APPLICATION

This application is based upon and claims the benefit of priority of the prior Japanese Patent Application No. 2013-102148, filed on May 14, 2013, the entire contents of which are incorporated herein by reference.

FIELD

The embodiments discussed herein are related to an oscillator.

BACKGROUND

A oscillator such as a differential-output-type oscillator transmits a signal such as a clock or data signal.

A related technique is disclosed in Japanese Laid-open Patent Publication No. 2007-37061.

SUMMARY

According to an aspect of the embodiment, an oscillator includes: a piezoelectric material configured to vibrate in a mode; a first inverting amplifier; a second inverting amplifier; a first output electrode configured to apply an output signal of the first inverting amplifier to the piezoelectric material; a second output electrode configured to apply an output signal of the second inverting amplifier to the piezoelectric material; a first input electrode configured to receive a voltage signal generated by the piezoelectric material and output the voltage signal to the first inverting amplifier; and a second input electrode configured to receive the voltage signal and output the voltage signal to the second inverting amplifier, wherein the first output electrode and the second output electrode are coupled to the piezoelectric material so that faces of the piezoelectric material move in opposite directions, and the first input electrode and the second input electrode are coupled to the piezoelectric material so that the voltage signals which are generated by the piezoelectric material and have opposite phases are input to the first input electrode and the second input electrode.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

As the operating speed of a circuit is increased or the operating voltage of the circuit becomes low, misoperation of the circuit may occur due to noise that affects a signal such as a clock or data signal.

In order to improve the noise immunity of the signal that is transmitted, such as a clock or data signal, differential-type signals may be used.

A differential-output-type oscillator generates differential-type signals as two synchronous signals having different polarities. The differential-type signals that have been transmitted are received by a receiving circuit. The receiving circuit generates a difference signal based on the difference between the two synchronous signals having different polarities.

Figure 1:
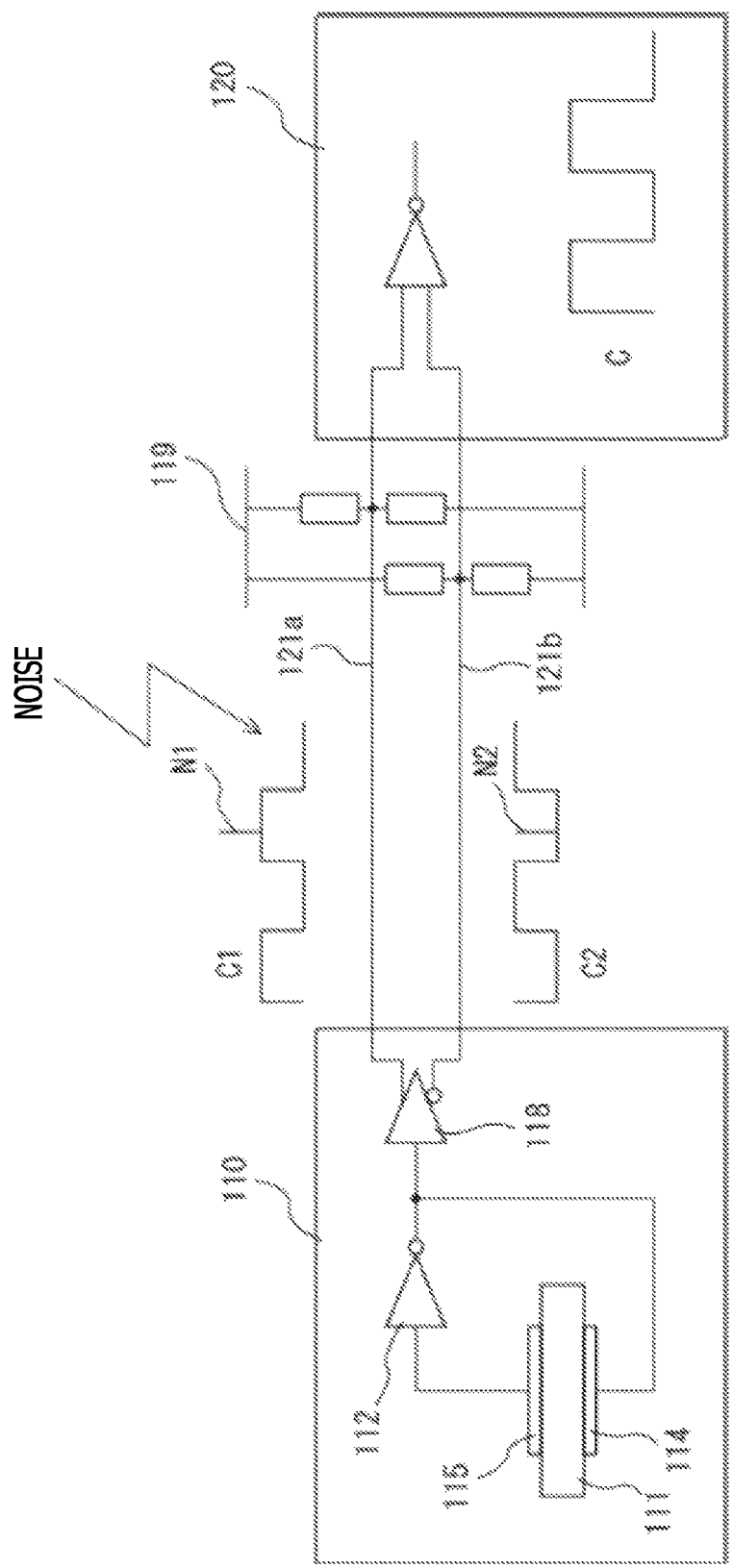
FIG. 1 illustrates an example of a differential-output-type oscillator.

FIG. 1 illustrates an example of a differential-output-type oscillator.

An oscillator 110 includes a crystal unit 111 that vibrates in a thickness shear mode, an inverter 112, an output electrode 114, an input electrode 115, and a differential-output-type buffer 118.

The output electrode 114 applies the output signal of the inverter 112 to the crystal unit 111. The input electrode 115 receives a voltage signal generated by the crystal unit 111, and outputs the voltage signal to the inverter 112. The inverter 112 receives the voltage signal generated by the crystal unit 111. The inverter 112 inverts and amplifies the voltage signal, and outputs the inverted and amplified voltage signal.

The oscillator 110 has a loop circuit that is formed by the crystal unit 111 and the inverter 112. The crystal unit 111 receives, from the inverter 112, feedback of the inverted and amplified signal, thereby vibrating at a resonant frequency to generate a voltage signal. The voltage signal that has been generated at the resonant frequency by the crystal unit 111 is input from the crystal unit 111 to the first inverter 12. The inverter 112 inverts and amplifies the voltage signal, and outputs the inverted and amplified signal to the output electrode 114 and the buffer 118.

The buffer 118 amplifies the output signal of the inverter 112, and outputs differential-type signals C1 and C2 to signal lines 121a and 121b.

The signal C1 is transmitted on the signal line 121a, terminated by a matching circuit 119, and received by a receiving circuit 120. The signal C2 is transmitted on the signal line 121b, terminated by the matching circuit 119, and received by the receiving circuit 120.

The receiving circuit 120 generates a signal C from the difference between the differential-type signals C1 and C2.

Noise from the outside may affect the signals C1 and C2 that are transmitted on the signal lines 121a and 121b, respectively. For example, noise N1 affects the signal C1, and noise N2 affects the signal C2. The noise N1 and the noise N2 simultaneously affect the signals C1 and C2. Thus, the noise N1 and the noise N2 may be in synchronization with each other, the size of the noise N1 and the size of the noise N2 may be the same, and the noise N1 and the noise N2 may have the same polarity.

In the receiving circuit 120, when the difference between the signal C1 and the signal C2 is obtained, the noise N1 and the noise N2 cancel each other out. Thus, the signal C from which the influence of noise has been removed is generated.

As described above, when the differential-type signals C1 and C2 are transmitted on the signal lines 121a and 121b, respectively, the signals C1 and C2 may be affected by noise.

Figure 2:
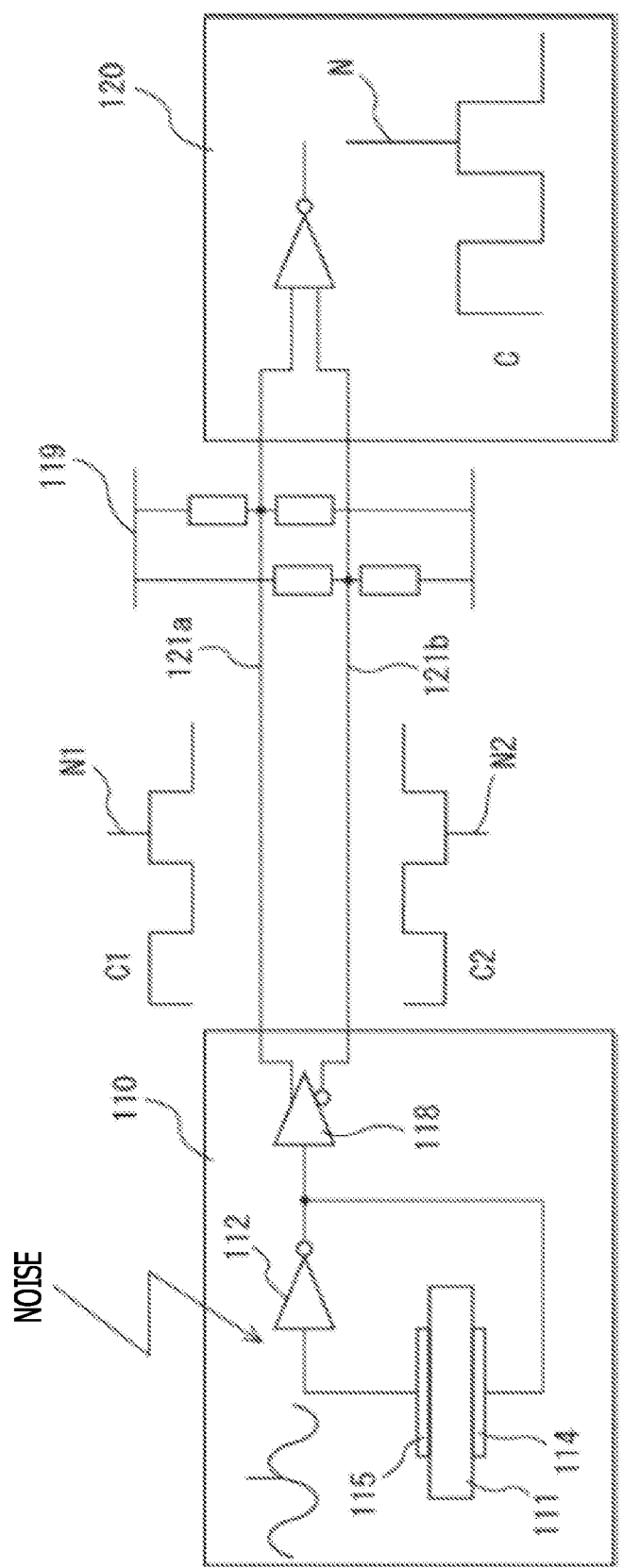
FIG. 2 illustrates an example of a differential-output-type oscillator.

FIG. 2 illustrates an example of a differential-output-type oscillator.

For example, noise from the outside may affect a signal flowing through the loop circuit that has the inverter 112 and the crystal unit 111 which are included in the oscillator 110. The buffer 118 receives a signal having noise is output from the inverter 112, and outputs the differential-type signals C1 and C2 that have been amplified.

For example, the signal C1 has the noise N1, and the signal C2 has the noise N2. The noise N1 and the noise N2 are in synchronization with each other, and the size of the noise N1 and the size of the noise N2 are substantially the same. However, the noise N1 and the noise N2 have opposite polarities.

When the difference between the signal C1 and the signal C2 is obtained in the receiving circuit 120, noise may not be not removed because the noise N1 and the noise N2 have opposite polarities. Thus, noise N that includes the amplified noise N1 and the amplified noise N2 may remain in the generated signal C.

Figure 3:
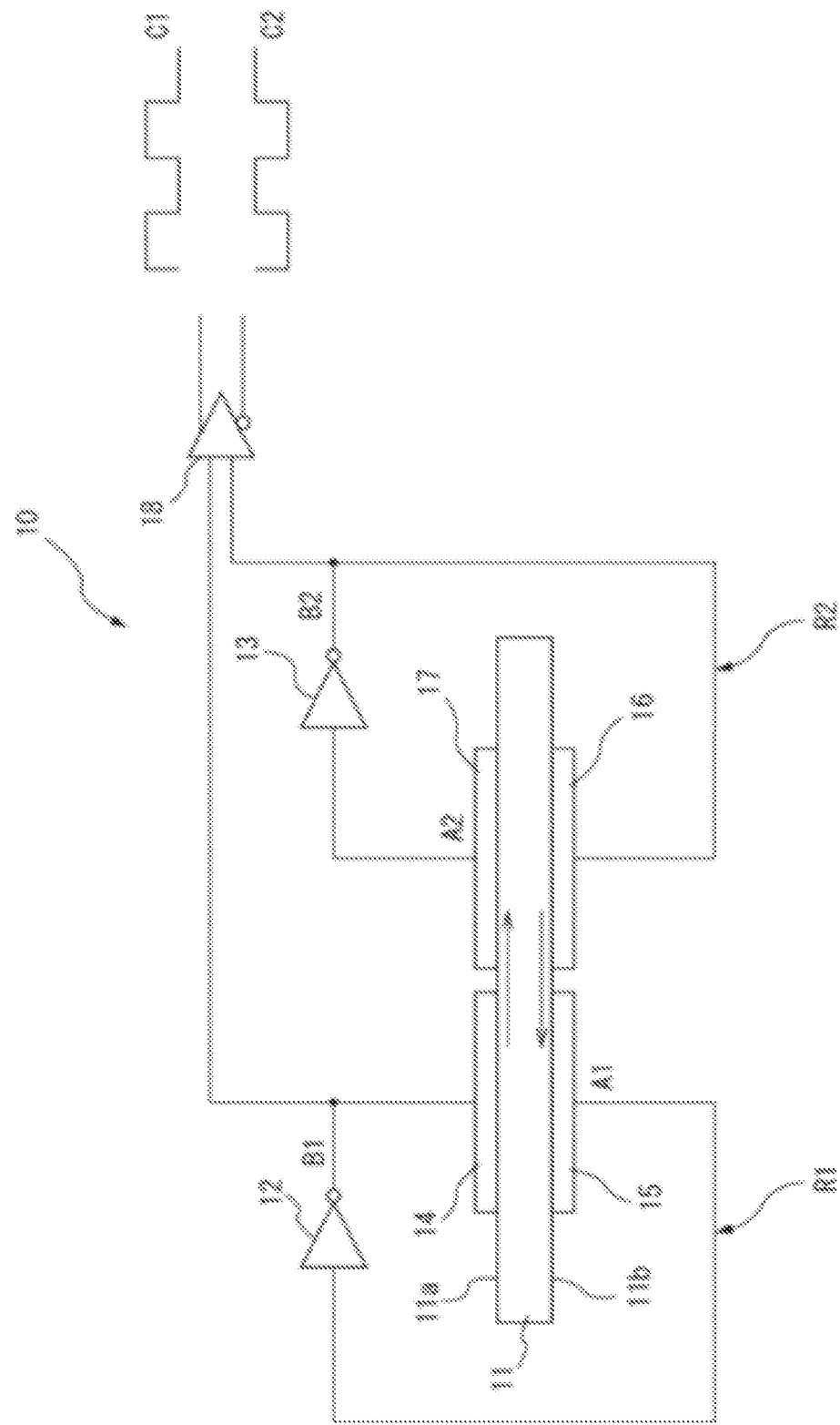
FIG. 3 illustrates an example of a differential-output-type oscillator.

FIG. 3 illustrates an example of a differential-output-type oscillator.

An oscillator 10 illustrated in FIG. 3 outputs differential-type signals C1 and C2. The signals C1 and C2 may be synchronous signals, may have substantially the same amplitude, and may have opposite polarities.

The oscillator 10 includes a crystal unit 11 that functions as a piezoelectric material which vibrates in the thickness shear mode, a first inverter 12, a second inverter 13, a first output electrode 14, a first input electrode 15, a second output electrode 16, a second input electrode 17, and a buffer 18.

The crystal unit 11 is cut so as to have a plate shape, and has a first face 11a and a second face 11b which vibrate in such a manner that the positions of the first face 11a and the second face 11b change in opposite directions. As the crystal unit 11 that vibrates in the thickness shear mode, for example, AT-cut or BT-cut crystal may be used. The crystal unit 11 may be a dielectric material, and may be an electrical insulator.

In the crystal unit 11, voltages having opposite polarities are applied to the first face 11a and the second face 11b, whereby the first face 11a and the second face 11b are driven so as to change the positions thereof in directions opposite to each other. Because the positions of the first face 11a and the second face 11b change in directions opposite to each other, voltages having opposite polarities may be generated from the first face 11a and the second face 11b.

As a piezoelectric material that vibrates in the thickness shear mode, in addition to a crystal unit, for example, lithium tantalate, lithium niobate, or the like that is cut so as to vibrate in the thickness shear mode may be used.

The first output electrode 14 is disposed on the first face 11a of the crystal unit 11. The first output electrode 14 applies a first output signal B1 of the first inverter 12 to the crystal unit 11. The first inverter 12 and the first output electrode 14 is coupled to each other by the signal line.

The first input electrode 15 is disposed on the second face 11b of the crystal unit 11. The first input electrode 15 receives a first voltage signal A1 generated by the crystal unit 11, and outputs the first voltage signal A1 to the first inverter 12. The first inverter 12 and the first input electrode 15 are coupled to each other by the signal line.

The first voltage signal A1 that has been generated by the crystal unit 11 is input to the first inverter 12. The first inverter 12 inverts and amplifies the first voltage signal A1 to obtain the first output signal B1, and outputs the first output signal B1. The first output signal B1 of the first inverter 12 is output to the first output electrode 14 and a first input part of the buffer 18.

A first loop circuit R1 having a loop in which a signal flows is formed by the crystal unit 11, the first inverter 12, the first output electrode 14, and the first input electrode 15.

In the first loop circuit R1, in order to set a resonant frequency, a capacitor may be disposed. The first loop circuit R1 may have a resistor element.

The second output electrode 16 is disposed on the second face 11b of the crystal unit 11 so as to be separated from the first input electrode 15. The second output electrode 16 may not be electrically coupled to the first input electrode 15. The second output electrode 16 applies a second output signal B2 of the second inverter 13 to the crystal unit 11. The second inverter 13 and the second output electrode 16 are coupled to each other by a signal line.

The second input electrode 17 is disposed on the first face 11a of the crystal unit 11 so as to be separated from the first output electrode 14. The second input electrode 17 may not be electrically coupled to the first output electrode 14. A second voltage signal A2 that has been generated by the crystal unit 11 is input to the second input electrode 17, and the second input electrode 17 outputs the second voltage signal A2 to the second inverter 13. The second inverter 13 and the second input electrode 17 are coupled to each other by a signal line.

The second inverter 13 receives the second voltage signal A2 generated by the crystal unit 11, inverts and amplifies the second voltage signal A2 to obtain the second output signal B2, and outputs the second output signal B2. The second output signal B2 of the second inverter 13 is output to the second output electrode 16 and a second input part of the buffer 18.

A second loop circuit R2 having a loop in which a signal flows is formed by the crystal unit 11, the second inverter 13, the second output electrode 16, and the second input electrode 17. The second loop circuit R2 may not be electrically coupled to the first loop circuit R1. The first loop circuit R1 and the second loop circuit R2 may be acoustically unified by vibration of the crystal unit 11.

In the second loop circuit R2, in order to set a resonant frequency, a capacitor may be disposed. The second loop circuit R2 may have a resistor element.

The capacitances of the capacitors are set so that the resonant frequency of the first loop circuit R1 and the resonant frequency of the second loop circuit R2 are substantially the same.

In the oscillator 10, the first output electrode 14 and the second output electrode 16 may be coupled to the crystal unit 11 so that the crystal unit 11 vibrates in the thickness shear mode in such a manner that the positions of the first face 11a and the second face 11b of the crystal unit 11 are changed in opposite directions. The first input electrode 15 and the second input electrode 17 may be coupled to the crystal unit 11 so that voltage signals having opposite phases, which are generated by vibration of the crystal unit 11 in the thickness shear mode, are input to the first input electrode 15 and the second input electrode 17.

The first output signal B1 of the first inverter 12 is applied via the first output electrode 14 to the first face 11a of the crystal unit 11. The crystal unit 11 is driven in the thickness shear mode, whereby the positions of the first face 11a and the second face 11b change in opposite directions. Thus, voltages having opposite polarities are generated from the first face 11a and the second face 11b by a piezoelectric effect.

The second inverter 13 receives, via the second input electrode 17, the second voltage signal A2 generated by the crystal unit 11. The second inverter 13 inverts and amplifies the second voltage signal A2 to obtain the second output signal B2, and outputs the second output signal B2. The second output signal B2 of the second inverter 13 is applied via the second output electrode 16 to the second face 11b of the crystal unit 11. The crystal unit 11 is driven in the thickness shear mode, whereby voltages having opposite polarities are generated from the first face 11a and the second face 11b.

The first inverter 12 receives, via the first input electrode 15, the first voltage signal A1 generated by the crystal unit 11. The first inverter 12 inverts and amplifies the first voltage signal A1 to obtain the first output signal B1, and outputs the first output signal B1.

The first voltage signal A1 and the second voltage signal A2 may be synchronous signals, may have substantially the same amplitude, and may have opposite polarities. The first output signal B1 and the second output signal B2 may be synchronous signals, may have substantially the same amplitude, and may have opposite polarities.

In the first loop circuit R1, the first inverter 12 receives the first voltage signal A1 having a phase opposite to the phase of the second voltage signal A2 generated by the crystal unit 11. The first inverter 12 outputs the first output signal B1 to the crystal unit 11 so as to change the position of the crystal unit 11 in a phase direction opposite to the phase of the second output signal B2.

In the second loop circuit R2, the second inverter 13 receives the second voltage signal A2 having a phase opposite to the phase of the first voltage signal A1 generated by the crystal unit 11. The second inverter 13 outputs the second output signal B2 to the crystal unit 11 so as to change the position of the crystal unit 11 in a phase direction opposite to the phase of the first output signal B1.

The first loop circuit R1 and the second loop circuit R2 resonate, while being acoustically unified, at substantially the same resonant frequency so as to have opposite phases, thereby generating differential-type signals that are synchronous signals.

The buffer 18 amplifies the individual output signals of the first inverter 12 and the second inverter 13 to obtain the differential-type signals C1 and C2 that are synchronous signals, and outputs the signals C1 and C2.

Figure 4:
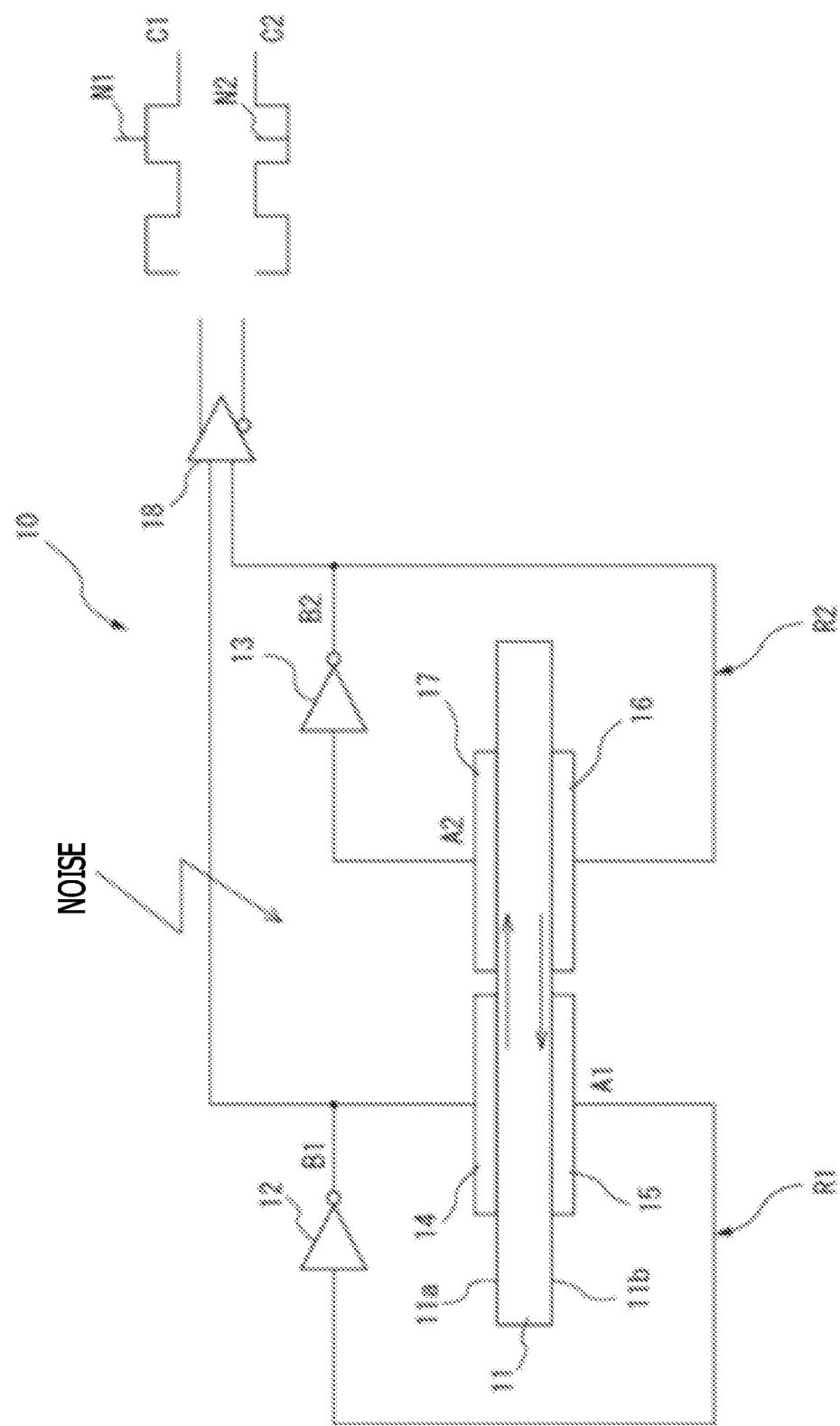
FIG. 4 illustrates an example of a differential-output-type oscillator.

FIG. 4 illustrates an example of a differential-output-type oscillator.

For example, noise from the outside may affect signals flowing through the oscillator 10 that has the first loop circuit R1 and the second loop circuit R2.

The first loop circuit R1 and the second loop circuit R2 are not electrically coupled to each other. Thus, noises that are synchronization with each other and that have the same phase may affect signals flowing through the individual circuits.

Noises having the same phase affect the signals C1 and C2 output from the buffer 18. The signal C1 may have noise N1, and the signal C2 may have noise N2. The noise N1 and the noise N2 may be in synchronization with each other. The size of the noise N1 and the size of the noise N2 may be substantially the same, and the noise N1 and the noise N2 may have the same polarity.

In a receiving circuit that has received the signals C1 and C2, when the difference between the signal C1 and the signal C2 is received, the noise N1 and the noise N2 cancel each other out. Thus, a signal from which the influence of noise has been removed may be generated.

Even in the case where the signals C1 and C2 output from the buffer 18 are affected by noise when the signals C1 and C2 are transmitted on line signals, as illustrated in FIG. 1, a signal from which the influence of noise has been removed may be generated.

In the oscillator 10, the differential-type signals C1 and C2 that are synchronous signals are generated by two circuit that are not electrically coupled to each other and that are independent of each other. Thus, even when the oscillator 10 is affected by noise, the noise N1 and the noise N2 having the same phase affect the signals C1 and C2, respectively. Therefore, when the difference between the signal C1 and the signal C2 is obtained in the receiving circuit, the noise N1 and the noise N2 cancel each other out. A signal from which the influence of noise has been removed may be generated. The noise immunity of the signal may be improved.

Figure 5:
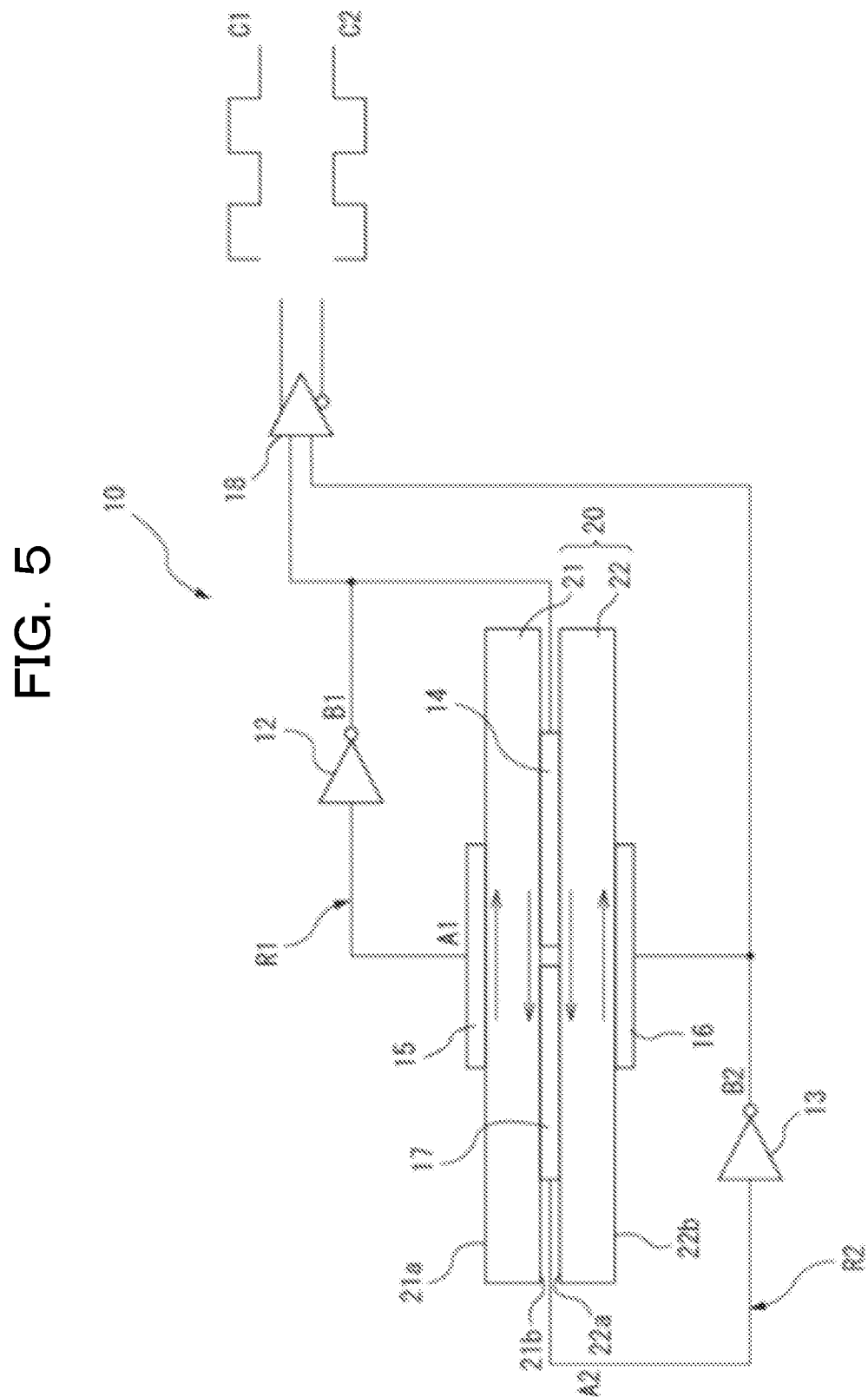
FIG. 5 illustrates an example of a differential-output-type oscillator.

FIG. 5 illustrates an example of a differential-output-type oscillator. In FIG. 5, components substantially the same as or similar to those illustrated in FIG. 3 or 4 are denoted by the same reference numerals, and a description thereof may be omitted or reduced.

In an oscillator 10 illustrated in FIG. 5, a crystal unit 20 includes a first crystal unit 21 and a second crystal unit 22.

The first crystal unit 21 is cut so as to have a plate shape, and has a first face 21a and a second face 21b which vibrate in the thickness shear mode in such a manner that the positions of the first face 21a and the second face 21b change in opposite directions. The second crystal unit 22 is cut so as to have a plate shape, and has a first face 22a and a second face 22b which vibrate in the thickness shear mode in such a manner that the positions of the first face 22a and the second face 22b change in opposite directions.

The first crystal unit 21 and the second crystal unit 22 are cut so as to have the same thickness in the same direction, and may have substantially the same natural frequency.

A first output electrode 14 and a second input electrode 17 are disposed between the second face 21b of the first crystal unit 21 and the first face 22a of the second crystal unit 22 so as to be separated from each other. The first output electrode 14 and the second input electrode 17 may not be electrically coupled to each other.

The first crystal unit 21 and the second crystal unit 22 may be joined together in such a manner that the first output electrode 14 and the second input electrode 17 intervene between the first crystal unit 21 and the second crystal unit 22. As a method for joining an electrode and a crystal unit, for example, a positive-electrode joining method may be used.

A first input electrode 15 is disposed on the first face 21a of the first crystal unit 21. A second output electrode 16 is disposed on the second face 22b of the second crystal unit 22.

A first loop circuit R1 having a loop in which a signal flows is formed by the first crystal unit 21, a first inverter 12, the first output electrode 14, and the first input electrode 15.

A second loop circuit R2 having a loop in which a signal flows is formed by the second crystal unit 22, a second inverter 13, the second output electrode 16, and the second input electrode 17. The second loop circuit R2 may not be electrically coupled to the first loop circuit R1.

In the first loop circuit R1 and the second loop circuit R2, capacitors are disposed so that the resonant frequency of the first loop circuit R1 and the resonant frequency of the second loop circuit R2 are substantially the same.

A first output signal B1 of the first inverter 12 is applied via the first output electrode 14 to the second face 21b of the first crystal unit 21. The first crystal unit 21 is driven in the thickness shear mode, whereby the positions of the first face 21a and the second face 21b change in opposite directions. Thus, voltages having opposite polarities are generated from the first face 21a and the second face 21b by a piezoelectric effect.

The second inverter 13 receives, via the second input electrode 17, a second voltage signal A2 generated by the first crystal unit 21. The second inverter 13 inverts and amplifies the second voltage signal A2 to obtain a second output signal B2, and outputs the second output signal B2. The second output signal B2 of the second inverter 13 is applied via the second output electrode 16 to the second face 22b of the second crystal unit 22. The second crystal unit 22 is driven in the thickness shear mode, whereby voltages having opposite polarities are generated from the first face 22a and the second face 22b.

The first inverter 12 receives, via the first input electrode 15, a first voltage signal A1 generated by the first crystal unit 21. The first inverter 12 inverts and amplifies the first voltage signal A1 to obtain the first output signal B1, and outputs the first output signal B1.

The first voltage signal A1 and the second voltage signal A2 may be synchronous signals, may have substantially the same amplitude, and may have opposite polarities. The first output signal B1 and the second output signal B2 may be synchronous signals, may have substantially the same amplitude, and may have opposite polarities.

In the first loop circuit R1, the first voltage signal A1 having a phase opposite to the phase of the second voltage signal A2 generated by the first crystal unit 21 is input to the first inverter 12. The first inverter 12 outputs the first output signal B1, which has a phase opposite to the phase of the second output signal B2, to the first crystal unit 21 so that the position of the first crystal unit 21 is changed in the phase direction opposite to the second output signal B2.

In the second loop circuit R2, the second voltage signal A2 having a phase opposite to the phase of the first voltage signal A1 generated by the second crystal unit 22 is input to the second inverter 13. The second inverter 13 outputs the second output signal B2, which has a phase opposite to the phase of the first output signal B1, to the second crystal unit 22 so that the position of the second crystal unit 22 is changed in the phase direction opposite to the first output signal B1.

In this manner, the first loop circuit R1 and the second loop circuit R2 resonate, while being acoustically unified, at substantially the same resonant frequency so as to have opposite phases, thereby generating differential-type signals that are synchronous signals.

A buffer 18 amplifies the individual output signals of the first inverter 12 and the second inverter 13 to obtain the differential-type signals C1 and C2 that are synchronous signals, and outputs the signals C1 and C2.

Figure 6:
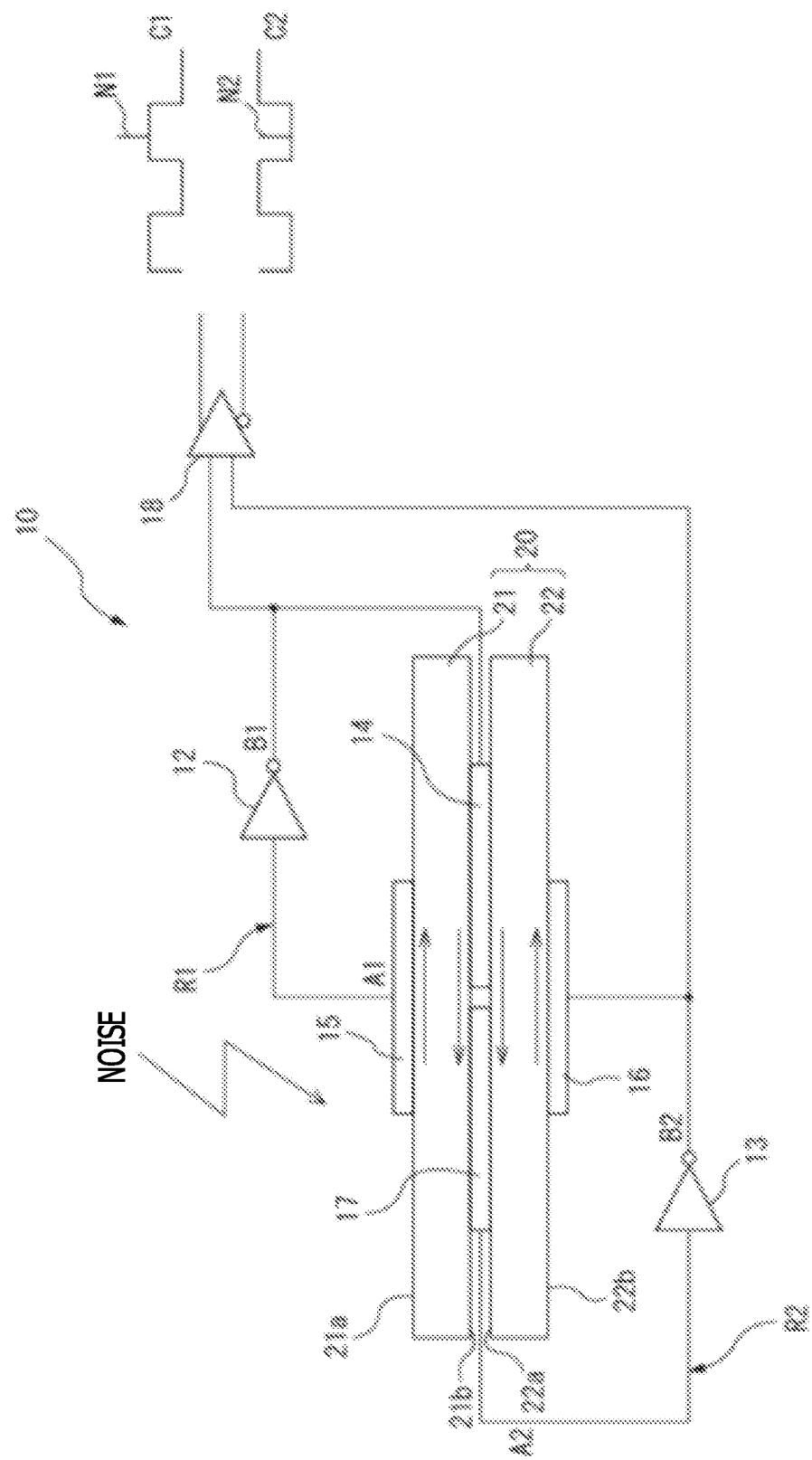
FIG. 6 illustrates an example of a differential-output-type oscillator.

FIG. 6 illustrates an example of a differential-output-type oscillator. In FIG. 6, components substantially the same as or similar to those illustrated in FIG. 3 or 4 are denoted by the same reference numerals, and a description thereof may be omitted or reduced.

Noise from the outside may affect signals flowing through the oscillator 10 that has the first loop circuit R1 and the second loop circuit R2.

For example, noises having the same phase may affect the signals C1 and C2 output from the buffer 18. For example, the signal C1 may have the noise N1, and the signal C2 may have the noise N2. The noise N1 and the noise N2 may be in synchronization with each other. The size of the noise N1 and the size of the noise N2 may be substantially the same, and the noise N1 and the noise N2 may have the same polarity.

In the receiving circuit that has received the signals C1 and C2, when the difference between the signal C1 and the signal C2 is obtained, the noise N1 and the noise N2 cancel each other out. Thus, a signal from which the influence of noise has been removed may be generated.

Even in the case where the signals C1 and C2 output from the buffer 18 are affected by noise when the signals C1 and C2 are transmitted on line signals, as illustrated in FIG. 1, a signal from which the influence of noise has been removed may be generated.

The oscillator 10 illustrated in FIG. 5 or 6 may have effects substantially the same as or similar to effects that the oscillator 10 illustrated in FIG. 3 or 4 has.

For example, the above-described oscillator may have buffers. In the case of outputting generated differential-type signals without amplifying the signals, the oscillator may not have the buffers.

The above-described oscillator may have inverters as inverting amplifiers. Each of the inverting amplifiers may have a circuit other than an inverter if the inverting amplifier is configured to receive a voltage signal generated by a piezoelectric material, and to invert and amplify the voltage signal.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An oscillator comprising:
   a piezoelectric material configured to vibrate in a mode;
   a first inverting amplifier;
   a second inverting amplifier;
   a first output electrode configured to apply an output signal of the first inverting amplifier to the piezoelectric material;
   a second output electrode configured to apply an output signal of the second inverting amplifier to the piezoelectric material;
   a first input electrode configured to receive a voltage signal generated by the piezoelectric material and output the voltage signal to the first inverting amplifier; and
   a second input electrode configured to receive the voltage signal and output the voltage signal to the second inverting amplifier,
   wherein the first output electrode and the second output electrode are coupled to the piezoelectric material so that faces of the piezoelectric material move in opposite directions, and the first input electrode and the second input electrode are coupled to the piezoelectric material so that the voltage signals which are generated by the piezoelectric material and have opposite phases are input to the first input electrode and the second input electrode.

2. The oscillator according to claim 1,
   wherein the piezoelectric material has a first face and a second face which vibrate in the mode in such a manner that the first face and the second face move in opposite directions with respect to one another.

3. The oscillator according to claim 2, wherein the first output electrode and the second input electrode are disposed on the first face so as to be separated from each other, and
   wherein the second output electrode and the first input electrode are disposed on the second face so as to be separated from each other.

4. The oscillator according to claim 1,
   wherein the piezoelectric material has a first piezoelectric material and a second piezoelectric material, wherein the first piezoelectric material has a first face and a second face which vibrate in the mode in such a manner that the first face and the second face move in opposite directions with respect to one another, wherein the second piezoelectric material has a third face and a fourth face which vibrate in the mode in such a manner that the third face and the fourth face moves in opposite directions with respect to one another.

5. The oscillator according to claim 4, wherein the first output electrode and the second input electrode are disposed between the second face and the third face so as to be separated from each other, and the first piezoelectric material and the second piezoelectric material are joined together in such a manner that the first output electrode and the second input electrode intervene between the first piezoelectric material and the second piezoelectric material, wherein the first input electrode is disposed on the first face, and wherein the second output electrode is disposed on the fourth face.

6. The oscillator according to claim 4, wherein the first piezoelectric material and the second piezoelectric material have substantially the same natural frequency.

7. The oscillator according to claim 1, further comprising an amplifier configured to receive an output of the first inverting amplifier and an output of the second inverting amplifier and output differential output signals.

8. The oscillator according to claim 1, wherein the first inverting amplifier and the second inverting amplifier are inverters.

9. The oscillator according to claim 1, wherein the mode is a thickness shear mode.

10. An oscillator comprising:

a piezoelectric material configured to vibrate in a mode, and include a first face and a second face which vibrate in such a manner that the first face and the second face move in opposite directions with respect to one another;

a first inverting amplifier;

a second inverting amplifier;

a first loop circuit formed by a first output signal of the first inverting amplifier, a first output electrode, formed on the first face, configured to receive the first output signal, and a first input electrode, formed on the second face at a position corresponding to the first output electrode, configured to output a first voltage signal of the piezoelectric material to an input of the first inverting amplifier; and a second loop circuit formed by a second output signal of the second inverting amplifier, a second output electrode, formed on the second face, configured to receive the second output signal, and a second input electrode, formed on the first face at a position corresponding to the second output electrode, configured to output a second voltage signal of the piezoelectric material to an input of the second inverting amplifier.

11. The oscillator according to claim 10, wherein an amplitude of the first voltage signal and an amplitude of the second voltage signal are substantially the same, and a polarity of the first voltage signal and a polarity of the second voltage signal are different from each other.

12. The oscillator according to claim 10, wherein an amplitude of the first output signal and an amplitude of the second output signal are substantially the same, and a polarity of the first output signal and a polarity of the second output signal are different from each other.

13. The oscillator according to claim 10, wherein the mode is a thickness shear mode.

* * * * *